(12) United States Patent
Klemmer

(10) Patent No.: US 6,211,708 B1
(45) Date of Patent: Apr. 3, 2001

(54) FREQUENCY DOUBLING CIRCUITS, METHOD, AND SYSTEMS INCLUDING QUADRATURE PHASE GENERATORS

(75) Inventor: Nikolaus Klemmer, Apex, NC (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/344,932

(22) Filed: Jun. 28, 1999

(51) Int. Cl.$^7$ ........................................ H03K 5/13
(52) U.S. Cl. ............................. 327/122; 327/238
(58) Field of Search ............................. 327/238, 355, 327/356, 357, 116, 119, 122

(56) References Cited

U.S. PATENT DOCUMENTS

| | | | | |
|---|---|---|---|---|
| 4,302,723 | * | 11/1981 | Moran | 324/343 |
| 5,495,194 | * | 2/1996 | Sugawara | 327/113 |
| 5,644,260 | * | 7/1997 | DaSilva et al. | 327/238 |
| 5,838,178 | | 11/1998 | Marbot | 327/116 |
| 5,847,623 | * | 12/1998 | Hadjichristos | 332/105 |
| 6,054,889 | * | 4/2000 | Kobayashi | 327/357 |
| 6,073,002 | * | 6/2000 | Peterson | 455/326 |

FOREIGN PATENT DOCUMENTS

| | | | |
|---|---|---|---|
| 0 153 019 | 8/1985 | (EP) | H03H/7/21 |
| 0 401 906 | 12/1990 | (EP) | H03H/7/21 |
| 88/02196 | 3/1988 | (WO) | H03B/27/00 |
| 92/15149 | 9/1992 | (WO) | H03B/5/00 |
| 98/45942 | 10/1998 | (WO) | H03H/11/04 |

* cited by examiner

Primary Examiner—Toan Tran
Assistant Examiner—Linh Nguyen
(74) Attorney, Agent, or Firm—Myers Bigel Sibley & Sajovec

(57) ABSTRACT

A frequency doubling circuit includes a quadrature phase generator and a mixer coupled to the quadrature phase generator. The quadrature phase generator receives a reference signal having a reference frequency and generates first and second quadrature phase shifted signals having the reference frequency. The mixer receives the first and second quadrature phase shifted signals and generates an output signal having an output frequency twice that of the reference frequency. Related methods and communications devices are also discussed.

42 Claims, 11 Drawing Sheets

FIG. 7.
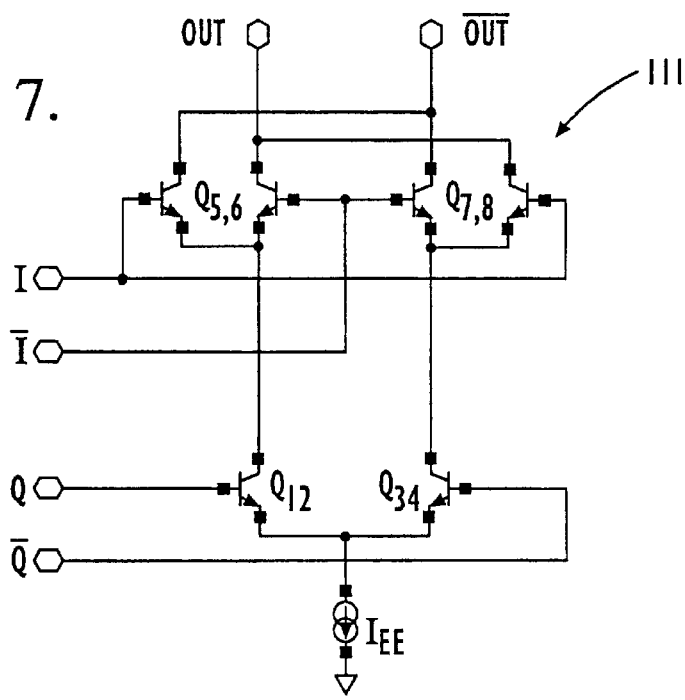
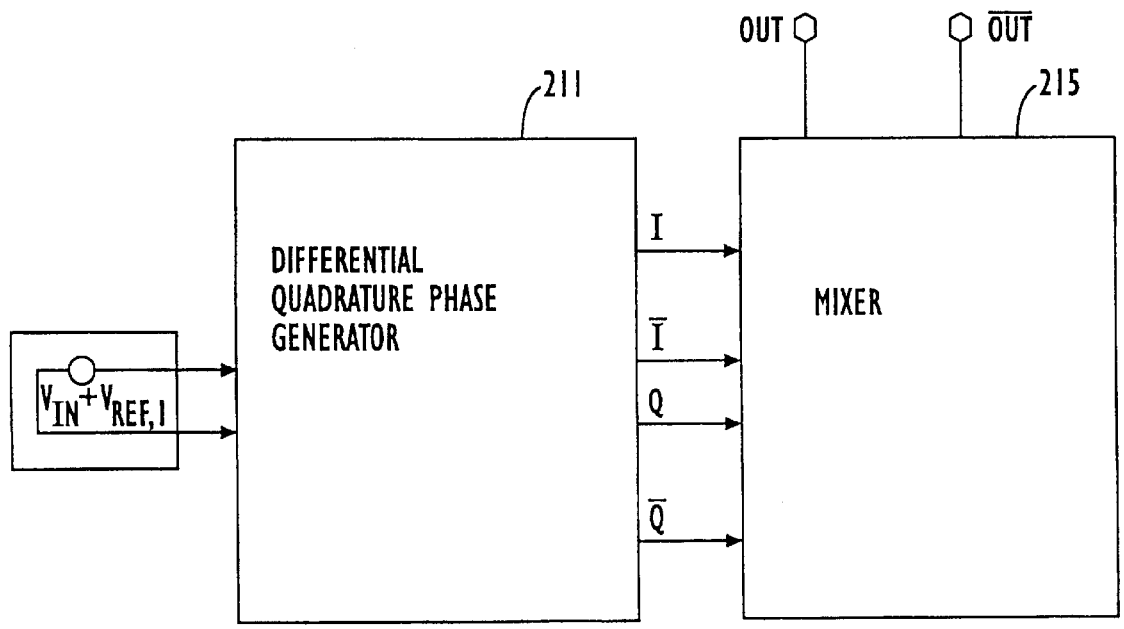
FIG. 8.

FREQUENCY DOUBLING CIRCUITS, METHOD, AND SYSTEMS INCLUDING QUADRATURE PHASE GENERATORS

FIELD OF THE INVENTION

The present invention relates to the field of electronics and more particularly to frequency doubling circuits and methods.

BACKGROUND OF THE INVENTION

Frequency doubling circuits are commonly used to generate a frequency doubled output signal having a frequency twice that of an input (or reference) signal. Various frequency doubling circuits are discussed, for example, in the following U.S. Patents: U.S. Pat. No. 5,475,349 to Cohn entitled "Frequency Multipliers Using Diode Arrays"; U.S. Pat. No. 5,194,820 to Besson et al. entitled "Frequency Doubling Device"; U.S. Pat. No. 4,691,170 to Riley entitled "Frequency Multiplier Circuit"; U.S. Pat. No. 5,365,181 to Mair entitled "Frequency Doubler Having Adaptive Biasing"; U.S. Pat. No. 4,048,571 to Jacobson entitled "Frequency Doubler"; U.S. Pat. No. 4,734,591 to lchitsubo entitled "Frequency Doubler"; and U.S. Pat. No. 5,552,734 to Kimura entitled "Local Oscillator Frequency Multiplier And Mixing Circuitry Comprising a Squaring Circuit". Each of these patents is hereby incorporated herein in its entirety by reference.

It is known, for example, to double the frequency of a reference signal A using a delay circuit 21 and an Exclusive-OR gate 23 as shown in FIGS. 1 and 2. In particular, the digital reference signal A is delayed by a period of time $\tau$ to generate the delayed signal B. The reference signal A can have rising edges occurring at times Tr and falling edges at times Tf. The resulting delayed signal B can thus have rising edges at times Tr+$\tau$ and the falling edges at times Tf+$\tau$. Accordingly, the output of the Exclusive-OR gate 23 can have a logical 1 output during the time intervals from Tr to Tr+$\tau$, and from Tf to Tf+$\tau$, and the output of the Exclusive-OR gate 23 can have a logical 0 output during the remainder of the time when the reference signal A and the delayed signal B are both either high or low. In other words, the output signal C generated by the Exclusive-OR gate 23 will have two pulses of duration $\tau$ for each period of the reference signal A in effect providing an output frequency twice that of the reference signal.

In the circuit of FIG. 1, however, it may be difficult to provide an output signal C having a 50% duty cycle. In particular, the duty cycle of the output signal C is dependent on the duration of the delay $\tau$ provided by the delay circuit 21, and the duration of the delay $\tau$ may be difficult to precisely control. If a delay $\tau$ can be one quarter of the period (T/4) of the reference signal A, the output signal will have a 50% duty cycle. Desired accuracies may be difficult to provide, however, because of the difficulty of providing low tolerance components such as capacitors and resistors to build a delay circuit.

For example, resistors and capacitors may both be subject to semiconductor manufacturing process fluctuations resulting in 3$\sigma$ tolerances as great as ±20%. Because the delay that is implemented depends on the RC product, the combined tolerance for the delay may be on the order of ±40%. In other words, a designed delay of 0.25 T may have process tolerance extremes of 0.16 T and 0.36 T resulting in duty cycle extremes of 32% and 72% which are significantly different from 50% (where T is the period of the reference signal).

When providing a frequency doubled output signal for a Radio Frequency (RF) mixer in the signal path of a radio communications transceiver, an accurate 50% duty cycle may be important to suppress even order intermodulation products. Accordingly, a bandpass filter may be needed at the output of the Exclusive-OR gate 23 to suppress even order harmonics of the frequency doubled output signal C thus adding circuitry. Furthermore, suitable bandpass filters may be difficult to implement on an integrated circuit device thereby increasing the size of the system including the frequency doubling circuit and filters.

In addition, the frequency doubled output signal is often used in a differential form in Radio Frequency (RF) integrated circuit applications. Such a differential form can be provided using the circuit illustrated in FIG. 3 including delay circuits 31 and 33 and Exclusive-OR gates 35 and 37. The circuit of FIG. 3 is essentially the combination of two FIG. 1 circuits being driven by a reference signal D and its inverse D-bar. This circuit, however, is subject to the same difficulties in providing a 50% duty cycle discussed above with regard to FIG. 1. In addition, the two delay circuits 31 and 33 should be closely matched to provide outputs that are truly differential. The desired matching, however, may be difficult to achieve.

Accordingly, there continues to exist a need in the art for improved frequency doubling circuits, methods, and systems.

SUMMARY OF THE INVENTION

It is therefore an object of the present invention to provide improved frequency doubling circuits, methods, and systems.

It is another object of the present invention to provide frequency doubling circuits, methods, and systems that can have improved output signal duty cycle performance.

It is still another object of the present invention to provide frequency doubling circuits, methods, and systems that can reduce generation of noise.

These and other objects can be provided according to the present invention by a frequency doubling circuit including a quadrature phase generator and a mixer coupled to the quadrature phase generator. The quadrature phase generator receives a reference signal having a reference frequency and generates first and second quadrature phase shifted signals having the reference frequency. The mixer receives the first and second quadrature phase shifted signals and generates an output signal having an output frequency twice that of the reference frequency.

The frequency doubling circuit of the present invention can thus provide an output signal with an accurate 50% duty cycle because a relative 90 degree phase shift can be provided between the two quadrature phase shifted signals. Moreover, the relative 90 degree phase shift can be provided accurately without requiring precision with respect to absolute values of components used in the quadrature phase generator. Instead, the accurate 90 degree phase shift can be provided by precisely matching the component values used in the quadrature phase generator, and precise matching of component values can be readily provided using components on a common integrated circuit substrate.

The frequency doubling circuit of the present invention can also be implemented as a differential frequency doubling circuit providing both a frequency doubled output signal and an inverse of the frequency doubled output signal. In particular, the quadrature phase generator can receive the reference signal having the reference frequency and an inverse reference signal that is 180 degrees out of phase with respect to the reference signal. In response, the quadrature phase generator generates third and fourth quadrature phase shifted signals so that the second, third, and fourth quadrature phase shifted signals are respectively shifted 90 degrees, 180 degrees, and 270 degrees with respect to the first quadrature phase shifted signal. The mixer can receive the four quadrature phase shifted signals to generate the output signal having the output frequency twice that of the reference frequency and to generate an inverse output signal that is 180 degrees out of phase with respect to the output signal. By generating the differential frequency doubled output signals, the effects of common mode noise can be reduced.

Frequency doubling circuits of the present invention can be used to double the frequency of either analog or digital signals. For example, the mixer can be an Exclusive-OR gate in a digital context or a multiplier in an analog context. More particularly, the mixer can be a Gilbert cell multiplier.

The quadrature phase generator can include a plurality of resistors and capacitors on an integrated circuit substrate wherein the resistors have a common resistance and the capacitors have a common capacitance. Precise matching of component values can be provided on an integrated circuit substrate even though it may be difficult to provide absolute values of the matched components with precision. A relative 90 degree phase relationship between the quadrature phase shifted signals can thus be provided with precision using the quadrature phase generator so that a precise 50% duty cycle is provided for the frequency doubled output signal.

The first quadrature phase shifted signal can thus have a positive phase shift relative to the reference signal, and the second quadrature phase shifted signal can have a negative phase shift relative to the reference signal. More particularly, the first quadrature phase shifted signal can have a positive 45 degree phase shift relative to the reference signal, and the second quadrature phase shifted signal can have a negative 45 degree phase shift relative to the reference signal.

The frequency doubling circuit of the present invention can thus be used to double the frequency generated by a voltage controlled oscillator in a dual mode radiotelephone to support two transmission/reception frequency ranges. Moreover, the quadrature phase generator and mixer of the frequency doubling circuit can be provided on a integrated circuit substrate including at least a portion of a receiver and/or a transmitter so that no additional components are needed.

BRIEF DESCRIPTION OF THE DRAWINGS

FIG. 7 is a schematic diagram of a mixer for use in a frequency doubling circuit according to the present invention.

FIG. 8 is a block diagram of a differential frequency doubling circuit according to the present invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
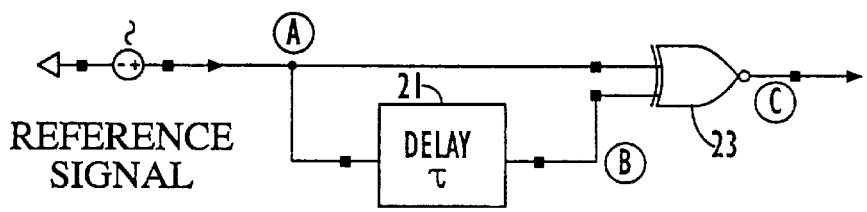
FIG. 1 is a schematic diagram illustrating a frequency doubling circuit according to the prior art.
Figure 2:
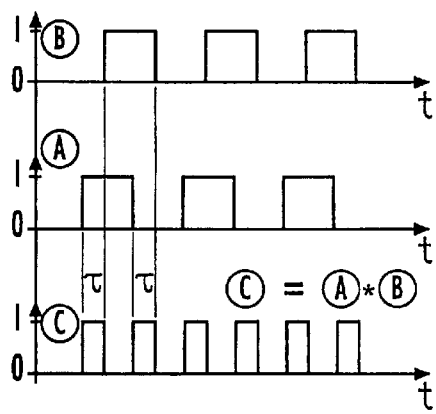
FIG. 2 illustrates signals generated by the frequency doubling circuit of FIG. 1.
Figure 3:
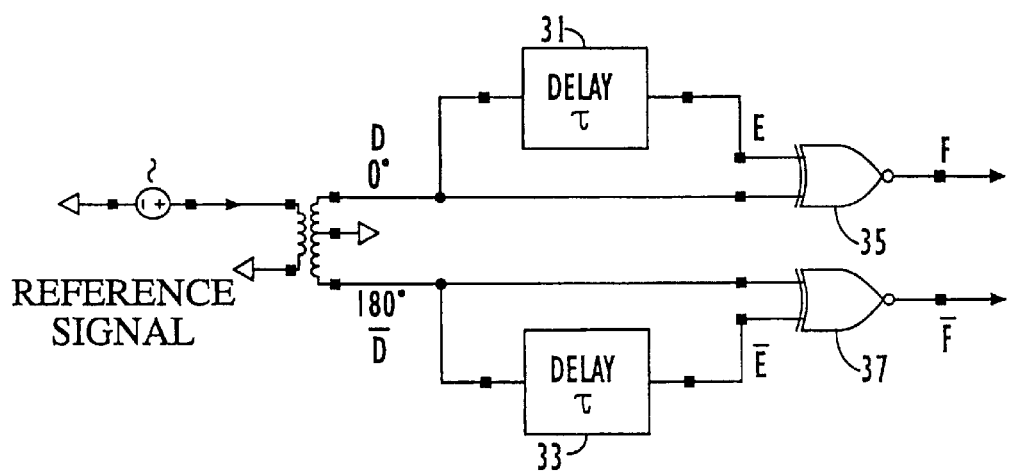
FIG. 3 is a schematic diagram of a second frequency doubling circuit according to the prior art.
Figure 4:
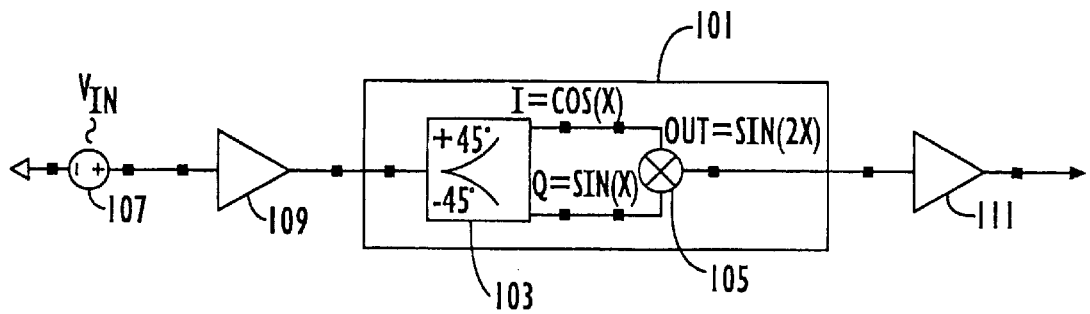
FIG. 4 is a block diagram of a frequency doubling circuit according to the present invention.

A schematic diagram of a frequency doubling circuit 101 according to the present invention is provided in FIG. 4. As shown, the frequency doubling circuit includes a quadrature phase generator 103 and a mixer 105. A reference signal Vin having a reference frequency is generated by a source 107 such as a voltage controlled oscillator, and a buffer 109 can be used to buffer the reference signal Vin. The quadrature phase generator 103 generates two quadrature phase shifted signals I=cos(x) and Q=sin(x) that are respectively shifted +45° and −45° relative to the reference signal Vin, so that the two quadrature phase shifted signals I and Q are shifted 90° relative to each other.

The two quadrature phase shifted output signals are then multipled using the mixer 105 to provide an output signal OUT=sin(2x) having a frequency two times that of the reference frequency of the reference signal Vin. The analog multiplication of the two quadrature phase shifted signals I and Q is provided below:

$$\sin(\omega t)*\sin(\omega t+90)=\sin(\omega t)*\cos(\omega t)=0.5*\sin(2\omega t).$$

The output signal OUT can then be provided to the output buffer 111.

Figure 5:
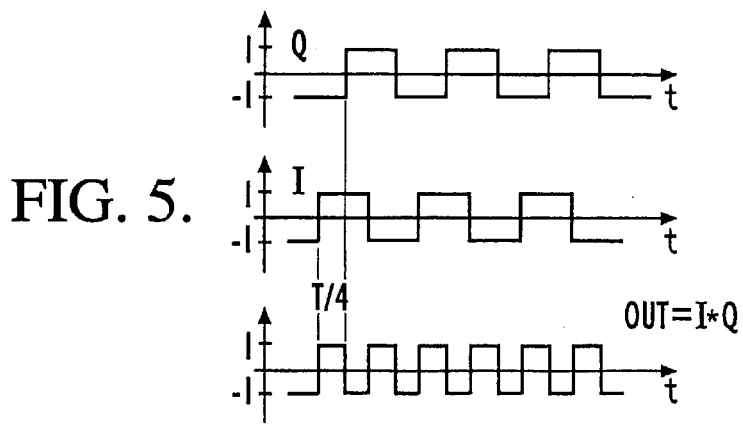
FIG. 5 illustrates signals generated by the frequency doubling circuit of FIG. 4.

The frequency doubling circuit 101 can thus provide an analog frequency doubled output for an analog input reference signal. The frequency doubling circuit of the present invention can also be used to provide a frequency doubled digital output for a digital input reference signal. In a digital application, the mixer 105 can be an Exclusive-OR gate. As shown in the example of FIG. 5, the digital quadrature phase shifted signals I and Q each have a frequency equal to that of the reference signal Vin, and the phases of the signals I and Q are shifted one quarter of a period T/4 (or 90°) relative to each other. By providing the signals I and Q to the inputs of an Exclusive-OR gate (mixer 105), the output signal can have a frequency two times that of the reference signal Vin.

Moreover, the output signal OUT has a 50% duty cycle, with each positive pulse (and negative pulse) having a duration of one quarter of a period T/4 of the frequency of the reference signal Vin.

The frequency doubling circuit of the present invention can thus accurately and reliably provide a frequency doubled output with a 50% duty cycle. In particular, the quadrature phase generator can accruately provide a relative 90° phase difference between the two quadrature phase shifted signals I and Q without relying on an absolute time delay of a delay circuit. In other words, the quadrature phase generator provides a 90° relative phase difference using a matching of component values without requiring that absolute component values be provided with accuracy. This advantage will be discussed in greater detail below.

The frequency doubling circuit of the present invention can be used, for example, in a dual mode radiotelephone to provide two transmit/receive frequency ranges using a single voltage controlled oscillator. A dual mode radiotelephone may operate, for example, according to the IS-136 standard (DAMPS) at 900 MHz and according to the PCS standard at 1800 MHz. A reference signal from a Voltage Controlled Oscillator can thus be coupled directly to the transmitter and receiver during IS-136 operations. During PCS operations, the reference signal can be doubled using the frequency doubling circuit. A second voltage controlled oscillator is not needed, and the frequency doubling circuit can be provided, for example, on an application specific integrated circuit (ASIC) used to provide the transmitter and/or receiver.

In addition, the frequency doubling circuit of FIG. 4 can generate a frequency doubled output without a DC component that might otherwise need to be stripped off. By providing frequency doubling for analog signals using a multiplier and for digital signals using an Exclusive-OR gate, the output of the frequency doubling circuit of the present invention can have little dependence on the amplitude of the input signal. Moreover, the frequency doubling circuit of the present invention can provide reduced power consumption, lower voltage operation, and an accurate 50% duty cycle.

The frequency doubling circuit of FIG. 4 can provide an output signal OUT having reduced even order harmonic content as long as the phase difference of the two quadrature phase shifted signals I and Q at the input of the mixer 105 is equal to 90 degrees. Given that component tolerances can be as great as ±20% for integrated circuit resistors and capacitors, delay circuits providing absolute delays may have tolerances of ±40% as discussed above in the Background of the Invention. Quadrature phase generators, however, can provide two quadrature phase shifted outputs with a relative phase shift of 90 degrees therebetween wherein the accuracy of the relative phase shift is dependent on an accuracy of a matching of component values as opposed to being dependent on an accuracy of absolute component values.

In particular, absolute values for resistor resistances may have 3 sigma tolerances of ±20%, but matching resistors of common dimensions can be provided on a common integrated circuit substrate with 3 sigma tolerances on the order of ±1%. Similarly, absolute values for capacitor capacitances may have 3 sigma tolerances of ±20%, but matching capacitors of common dimensions can be provided on a common integrated circuit substrate with 3 sigma tolerances on the order of ±1%. Quadrature phase generators can thus provide quadrature phase shifted signals I and Q with accurate relative phase shifting of 90 degrees therebetween using the precise matching of component values that can be achieved on an integrated circuit device even though the absolute values of the components may have process tolerances of ±20%.

Figure 6:
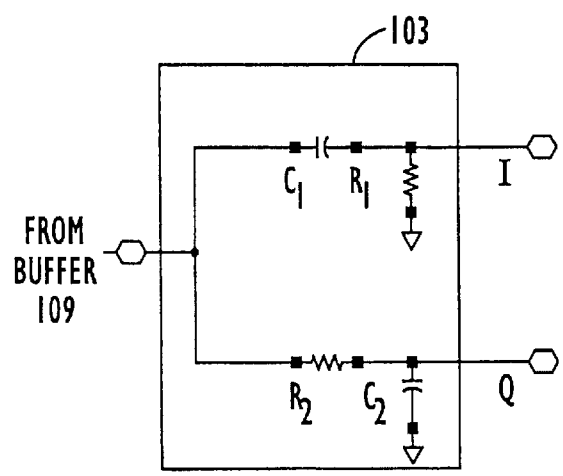
FIG. 6 is a schematic diagram of a quadrature phase generator according to FIG. 4.

FIG. 6 is a schematic diagram of a quadrature phase generator 103 that can be used in the frequency doubling circuit of FIG. 4. For the sake of this discussion, the load impedances at the output nodes I and Q are assumed to be infinite. With infinite load impedances, the phase of the quadrature phase shifted signal I relative to the reference signal Vin will be:

$$\Phi_I = \arctan(1/\omega C_1 R_1).$$

Similarly, the phase of the quadrature phase shifted signal Q relative to the reference signal Vin will be:

$$\Phi_Q = -\arctan(\omega C_2 R_2).$$

Assuming the resistors $R_1$ and $R_2$ are equal with a value R, and assuming that the capacitors $C_1$ and $C_2$ are equal with a value C, the trigonometric identity, $$\arctan(x) + \arctan(1/x) = \pi/2,$$

can be applied. Accordingly:

$$\Phi_I + \Phi_Q = \pi/2 (=90 \text{ degrees}).$$

The relative phase difference of the quadrature phase shifted signals I and Q can thus be equal to 90 degrees for all frequencies, provided the resistors $R_1$ and $R_2$ and the capacitors $C_1$ and $C_2$ are equal. In addition, the relative phase difference of 90 degrees can be maintained even when the load impedances are not infinite as long as the load impedances at the nodes I and Q are equal.

The relative phase difference provided by the quadrature phase generator 103 of FIG. 6 does not rely on absolute component values to provide a 90 degree relative phase shift between the quadrature phase shifted signals. Instead, the quadrature phase generator 103 relies on the accurate matching of resistors and capacitors which can be provided in close proximity on an integrated circuit substrate. Matching of these component values can thus be provided on the order of ±1%, so that the relative phase shift can be controlled to within 0.005 radians (0.3 degrees). Other factors such as imbalances of the load impedances, and parasitic substrate capacitances associated with the capacitors and resistors may provide a practically available mismatch of about 0.02 radians (1.1 degrees).

For the output of the frequency doubling circuit 101 of FIG. 4 including the quadrature phase generator 103 of FIG. 6, the time instances when transistions occur are accurate to within 0.02/(2π) times the period of the input frequency. Because the frequency of the output signal OUT is twice the frequency of the reference signal Vin, the accuracy of the duty cycle of the output signal OUT can be 2*0.02/(2π)= 0.0063. A duty cycle of the frequency doubled output signal OUT can thus be accurately provided in the range of 49.4% to 50.6%.

An example of a differential Exclusive-OR gate 111 (referred to generically as a mixer) in its bipolar implementation that can be used in the mixer 105 of FIG. 4 is illustrated in FIG. 7. To complete the mixer 105 of FIG. 4, two inverters may be needed to provide the inverted quadrature phase shifted signals. The Exclusive-OR gate 111 can be implemented in any semiconductor technology that provides current switching devices where switching action is dependent on the voltage at a control node. Implementation can thus also be provided, for example, in MOSFET, GsAsFet, and HBT technologies. The Exclusive-OR gate 111 is commonly referred to as an "XOR gate" in the context of digital emitter coupled logic (ECL), and as a Gilbert cell mixer in the context of radio frequency (RF) integrated circuit (IC) design. Gilbert cell mixers are discussed in the reference by Barrie Gilbert entitled "*A Precise Four-Quadrant Multiplier with Subnanosecond Response*" (IEEE Journal of Solid State Circuits, Vol. SC-3, p. 365–373, December 1968), and in Section 10.3 of the textbook by Gray et al. entitled "*Analysis and Design of Analog Integrated Circuits*" (John Wiley and Sons, N.Y., 1993, pp. 670–675). The disclosures of both of these references are hereby incorporated herein in their entirety by reference.

In particular, the differential output current (the difference between the currents through the OUT and OUT-bar nodes) can be equal to:

$$I_{OUT} = I_{EE} * \tan h(V_1/2V_T) * \tan h(V_Q/2V_T),$$

where $V_T$ is approximately the thermal voltage (26 mV at 300K). It can thus be seen that for small differential input voltages $<<V_T$, the circuit behaves like a true multiplier. In particular, for small differential input voltages, $$I_{OUT,Small\ Signal} = I_{EE} * (V_1/2V_T)*(V_Q/2V_T).$$

In this situation, the Exclusive-OR gate 111 can be used in the frequency doubling circuit of FIG. 4 to provide frequency doubling for analog reference signals.

For higher input signal amplitudes $>2V_T$, the tan h( ) function may approach its limiting values (±1) for a significant fraction of the total period of the input signal. In practice, this may mean that the transistors $Q_{12}$, $Q_{34}$, $Q_5$, $Q_6$, $Q_7$, and $Q_8$ behave as current switches. The current sourced by the current source $I_{EE}$ is directed through the transistor pair that has a higher voltage applied to the base (or gate in a MOS implementation). Accordingly, the output signal and shape (i.e. harmonic content) may not strongly depend on the amplitudes and the particular shapes of the input signals as long as they are greater than $2V_T$ (=52 mV@300K).

Furthermore, the Exclusive-OR gate III will add only a relatively small amount of noise to noise present in the input signals. In particular, the transistors will not add significant noise when they are fully switched. Significant noise is only added during operation in the linear region during the fraction of the period of the input signals when the input voltage magnitude is lower than approximately $2V_T$. With a 250 mV peak input voltage amplitude, the transistors of the gate 111 spend less than 20% of the time in the linear region.

From the circuit topology, it can be seen that the Exclusive-OR gate is fully differential and that the biasing current $I_{EE}$ is being toggled among the different devices. The current sum at the outputs OUT and OUT-bar is equal to this biasing current, and the supply current of the doubler is constant over time during frequency doubling operations. Coupling of signals within the frequency doubling circuit onto supply voltage lines within the integrated circuit device (due to package lead and bonding inductances) can be reduced. This in turn results in low crosstalk of these signals into other circuit blocks that may be connected to the same supply lines inside the integrated circuit device.

During large signal operation, the Exclusive-OR gate 111 functions in a current switching fashion. In other words, all the current coming from the biasing current source is alternately directed to one output node or the other. Improved efficiencies can thus be provided. In addition, the output signals generated by the Exclusive-OR gate can be nearly square waves. The noise and gain parameters of circuits coupled to the outputs OUT and OUT-bar can thus be improved.

When implemented using technologies other than bipolar, the specific dependence of the output current on the input voltages may be different from that discussed above. The general behavior, however, is the same. More particularly, the multiplying action for small input signal amplitudes and the current switching action for high input signal amplitudes can be preserved. Particular examples of frequency doubling circuits including a quadrature phase generator and a multiplier/XOR-gate (referred to generically as a mixer) combination will now be discussed with reference to FIGS. 8–15.

FIG. 8 is a block diagram illustrating a frequency doubling circuit according to the present invention including a differential quadrature phase generator 211 and a mixer 215 as discussed above with regard to FIG. 7. As shown, the differential quadrature phase generator 211 can receive the AC reference signal Vin including a DC component Vref,1 as well as the inverse of the AC reference signal. In response, the differential quadrature phase generator 211 generates the quadrature phase shifted signals I and Q and the inverses of the quadrature phase shifted signals I-bar and Q-bar. The mixer 215 generates the output signal OUT having a frequency twice that of the reference signal Vin with a 50% duty cycle, and the inverse of the output signal OUT-bar.

Figure 9:
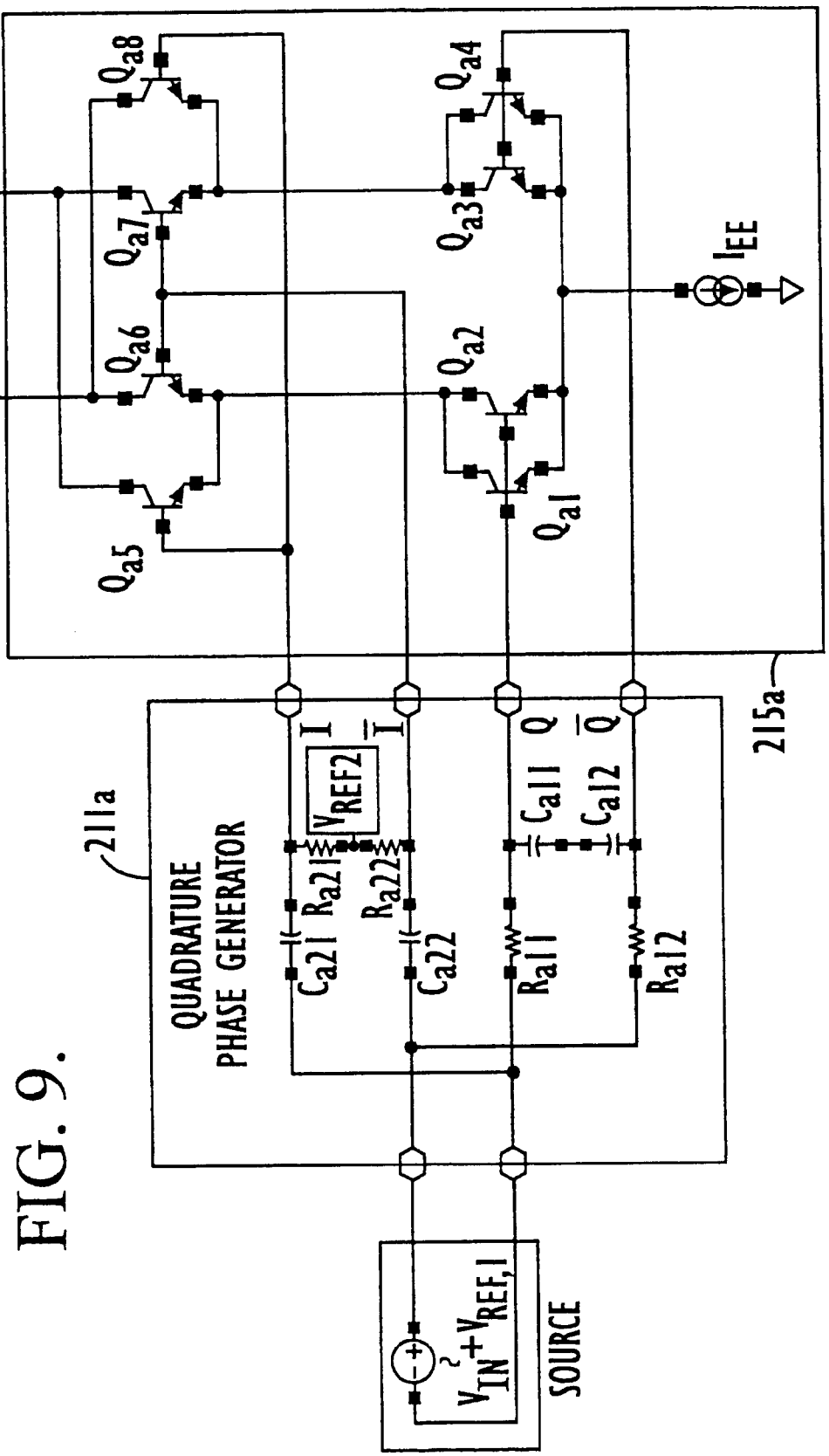
FIG. 9 is a schematic diagram of a first differential frequency doubling circuit according present invention.

FIG. 9 is a schematic diagram illustrating a voltage mode implementation of a frequency doubling circuit including a differential quadrature phase generator 211a and a mixer 215a (also referred to as an Exclusive-OR gate). The circuit of FIG. 9 is referred to as a voltage mode implementation because voltages at the output of the differential quadrature phase generator control the mixer and hence the frequency doubling. The impedance of the source providing the reference signal Vin will not significantly affect the accuracy of the differential quadrature phase generator 211a.

The DC component Vref,1 is overlaid on the reference signal Vin, and passes through the resistors $R_{a11}$ and $R_{a12}$ to the lower portion of the mixer 215a. This DC component provides biasing for the transistors $Q_{a1}$, $Q_{a2}$, $Q_{a3}$, and $Q_{a4}$. The upper portion of the mixer can be biased using a second DC biasing voltage Vref,2 that is applied to the virtual ground node between the resistors $R_{a21}$ and $R_{a22}$. The specific values of the biasing voltages can be determined using techniques known to those having skill in the art. In addition, it will be understood that the output nodes OUT and OUT-bar can be coupled through respective pull-up resistors to a positive supply voltage line for the circuit. In particular, the frequency doubling circuit can be provided on an integrated circuit device, and the positive supply voltage line for the circuit can be a positive supply voltage line for the integrated circuit device. Accordingly, some parasitic inductance between the supply voltage line and system power source (such as a battery) may result from the integrated circuit packaging and wire bonding. Similarly, some parasitic inductance may also occur between the current source $I_{EE}$ and system ground.

The resistors $R_{a11}$, $R_{a12}$, $R_{a21}$, and $R_{a22}$ preferably have equal resistances (R), and the capacitors $C_{a11}$, $C_{a12}$, $C_{a21}$, and $C_{a22}$ preferably have equal capacitances (C) to provide equal impedances at the output of the differential quadrature phase generator 211a. The preferred choice for the time constant of the differential quadrature phase generator is such that $2\pi f_{IN}*RC=1$ (although this in not necessary for proper operation).

To maintain accuracy of the quadrature phase relationships of the differential quadrature phase generator outputs I, Q, I-bar, and Q-bar, it is desirable to provide equal load impedances at each of the inputs of the mixer 215a. As shown in FIG. 9, each of the inputs feeds the bases of the same number of transistors. In particular, each input into the mixer feeds the bases of two transistors. The generation of even harmonics of the frequency doubled output signal and its inverse can thus be reduced.

Figure 10A:
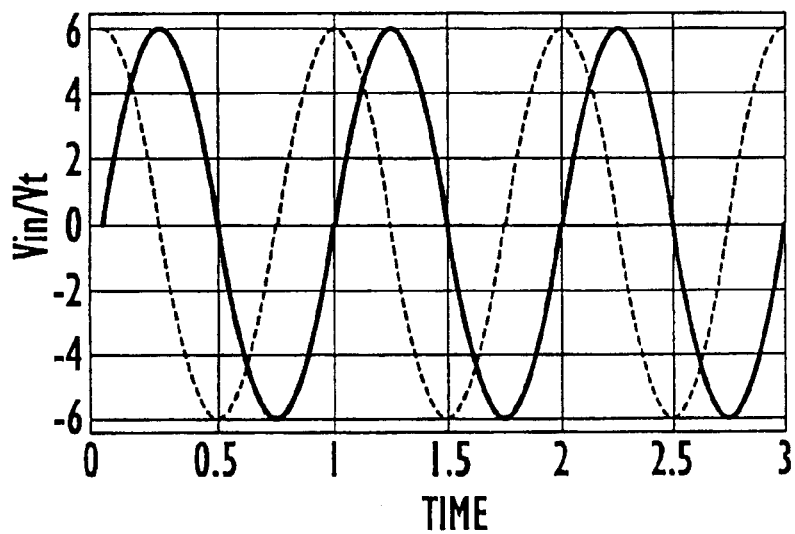
FIGS. 10A and 10B illustrate waveforms generated by the first differential frequency doubling circuit of FIG. 9.
Figure 10B:
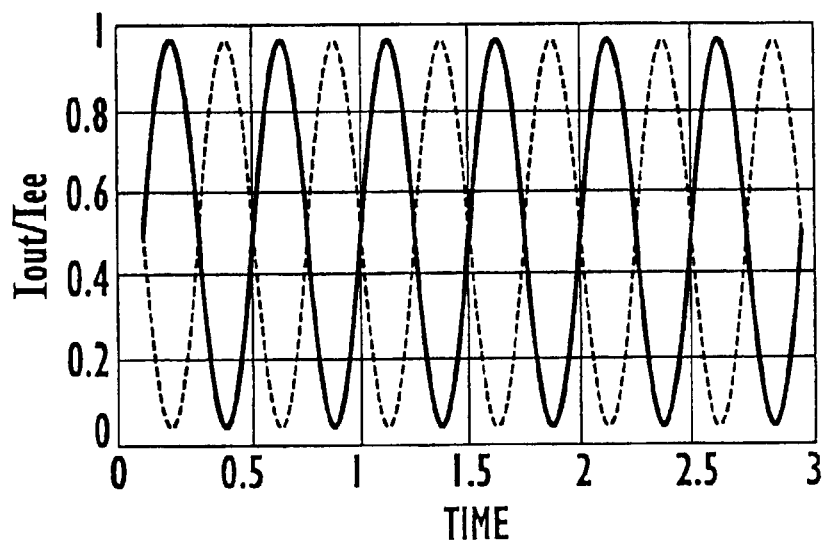

FIGS. 10A and 10B respectively illustrate typical waveforms at the output of the differential quadrature phase generator 211a and the resulting current waveforms at the output of the mixer 215a. The output currents can be converted to output voltages by including collector pull-up resistors between the output nodes OUT and OUT-bar and the positive supply voltage line for the integrated circuit.

Although the input voltage amplitudes are only $6V_T$ (150 mV peak), it can be seen that the output currents are almost fully switched during peaks of the input voltages. Increasing the input voltage further may "square-up" the waveforms at the mixer outputs. In other words, the transitions may become sharper. In practice, the slope of the output signal transitions may also be limited by the lowpass behavior of the mixer gate outputs. Lowering the cutoff frequency at the output may lower the current consumption of the circuit in a practical implementation.

Figure 11:
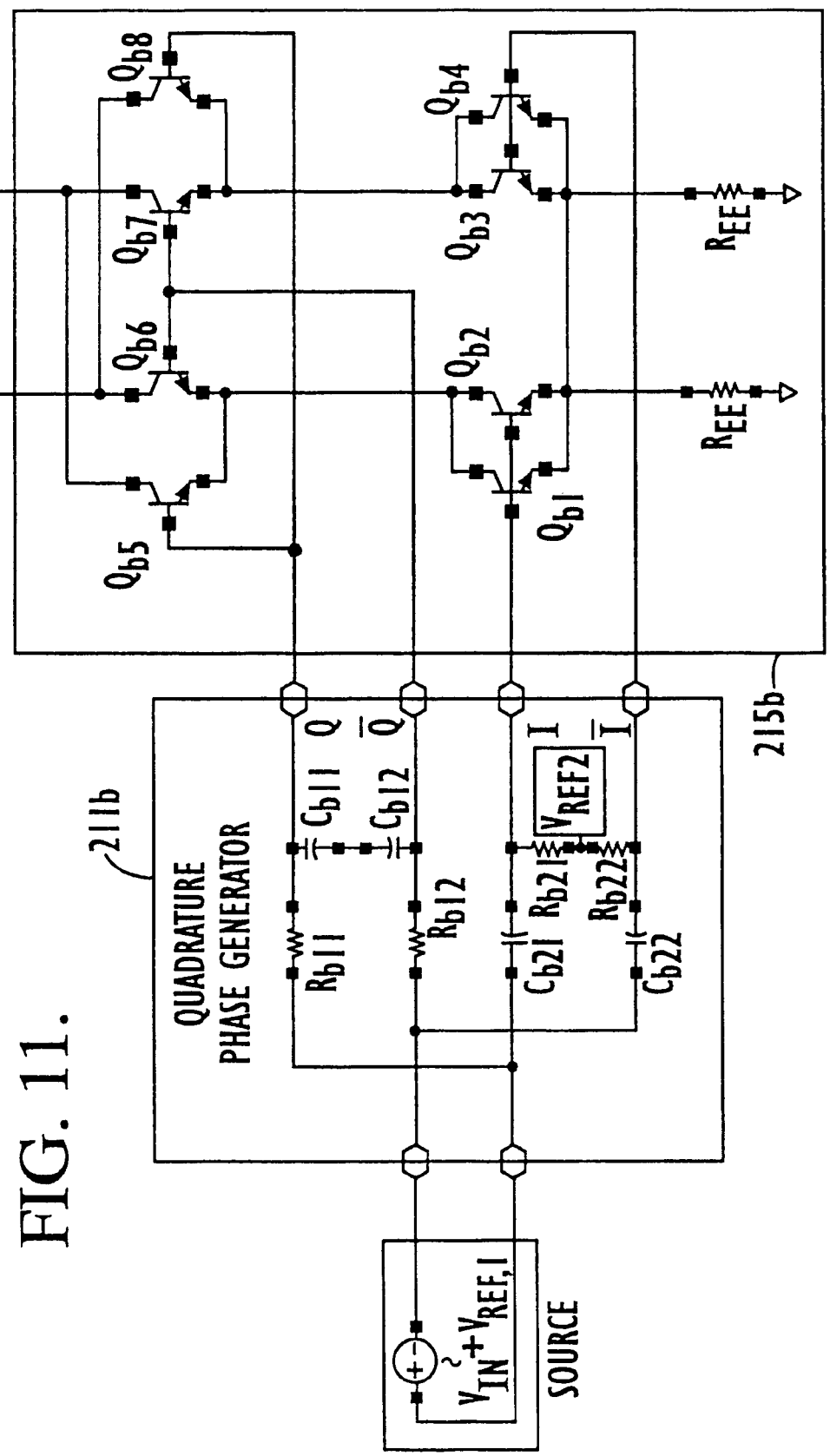
FIG. 11 is a schematic diagram of a second differential frequency doubling circuit according to the present invention.

FIG. 11 is a schematic diagram illustrating a quasi-differential implementation of the voltage mode implementation of FIG. 9. The major difference between the implementation of FIG. 11 and that of FIG. 9 is that the implementation of FIG. 11 does not include the current source. In the circuit of FIG. 11, the biasing current is set by the biasing voltage Vref2 and the resistors $R_{EE}$. The generation of reference voltages to provide process insensitivity and desired temperature behavior of the biasing current in the mixer will be understood by those having skill in the art. The biasing voltage Vref1 can be used to bias the upper portion of the mixer. The outputs of the differential quadrature phase generator are coupled to the mixer differently without any significant impact on the functionality of the frequency doubling circuit.

Figure 12A:
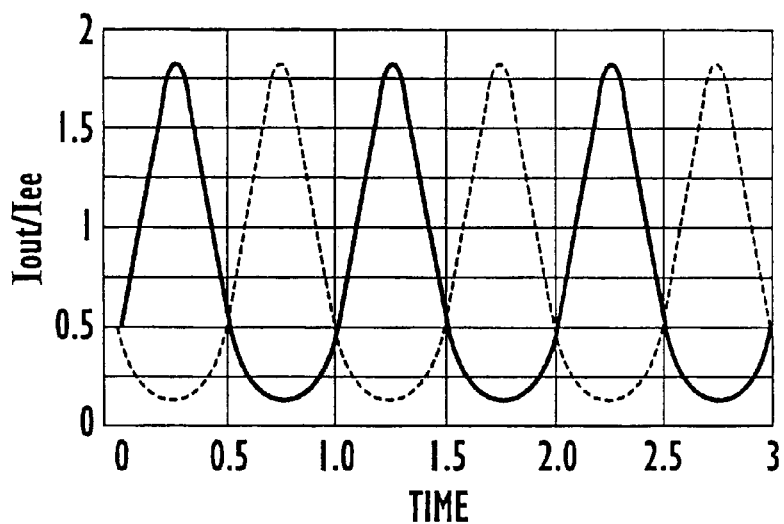
FIGS. 12A and 12B illustrate waveforms generated by the second differential frequency doubling circuit of FIG. 11.
Figure 12B:
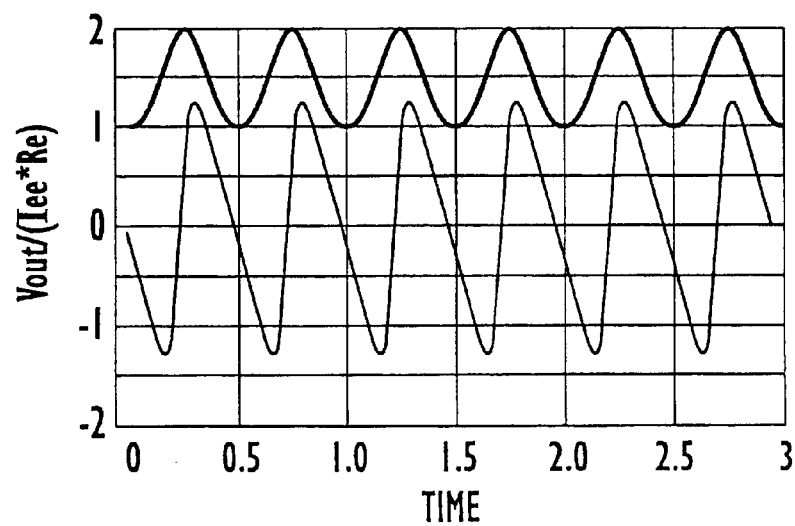

One advantage of the quasi-differential implementation of FIG. 11 over the fully differential implementation of FIG. 9 is that the quasi-differential implementation can operate using a lower supply voltage. In particular, a supply voltage headroom provided for the current source of FIG. 9 (about 400 mV) is not needed in the circuit of FIG. 11. For example, the frequency doubling circuit of FIG. 11 can operate using a supply voltage as low as 2V. The supply current drawn by the frequency doubling circuit of FIG. 11, however, may not be constant over time during large signal operation. In particular, the current may vary if the input voltage amplitude of the signals I and I-bar exceeds the biasing voltage drop across the resistors $R_{EE}$. In other words, the operation of the transistors $Q_{b1}$, $Q_{b2}$, $Q_{b3}$, and $Q_{b4}$ may be nonlinear when the amplitude of the signals I and I-bar exceeds the biasing voltage drop across the resistors $R_{EE}$, as shown in FIGS. 12A and 12B. In particular, FIG. 12A illustrates the single ended output current waveforms, and FIG. 12B illustrates the differential output voltage when the outputs are connected to the positive supply voltage line via respective collector pull-up resistors Rc. The total supply current of the quasi-differential mixer 215b is also shown.

Although the differential output signal is not symmetrical due to nonlinear operation of the transistors $Q_{b1}$, $Q_{b2}$, $Q_{b3}$, and $Q_{b4}$, the zero crossings of the frequency doubled output signal still occur at evenly spaced points in time. In other words, the even harmonics of the frequency doubled output signal can be suppressed. The peak output amplitude can be increased over the fully differential circuit with the same biasing current due to the nonlinear operation of the transistors $Q_{b1}$, $Q_{b2}$, $Q_{b3}$, and $Q_{b4}$ in the mixer.

Figure 13:
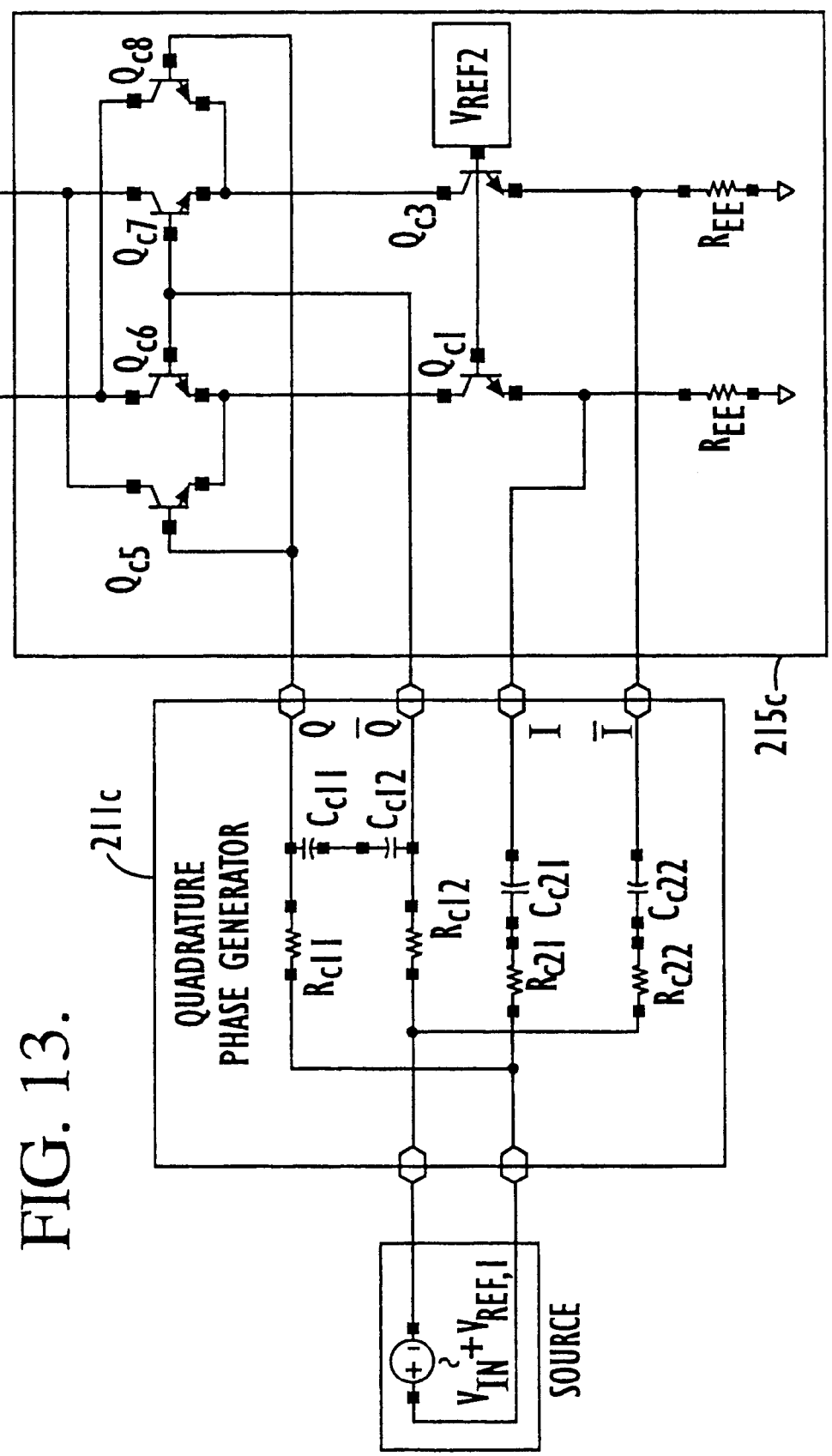
FIGS. 13 and 14 are schematic diagrams of respective third and fourth differential frequency doubling circuits according to the present invention.

A mixed voltage/current mode implementation of a frequency doubling circuit according to the present invention is illustrated in FIG. 13. The implementation of FIG. 13 can provide low voltage operation because the signals into the lower portion of the mixer 215c are in the current domain, and there is reduced voltage swing on the bases of the transistors $Q_{c1}$ and $Q_{c3}$. The frequency doubling circuit of FIG. 13 can thus operate using supply voltages in the range of 1.2V to 1.5V.

Figure 14:
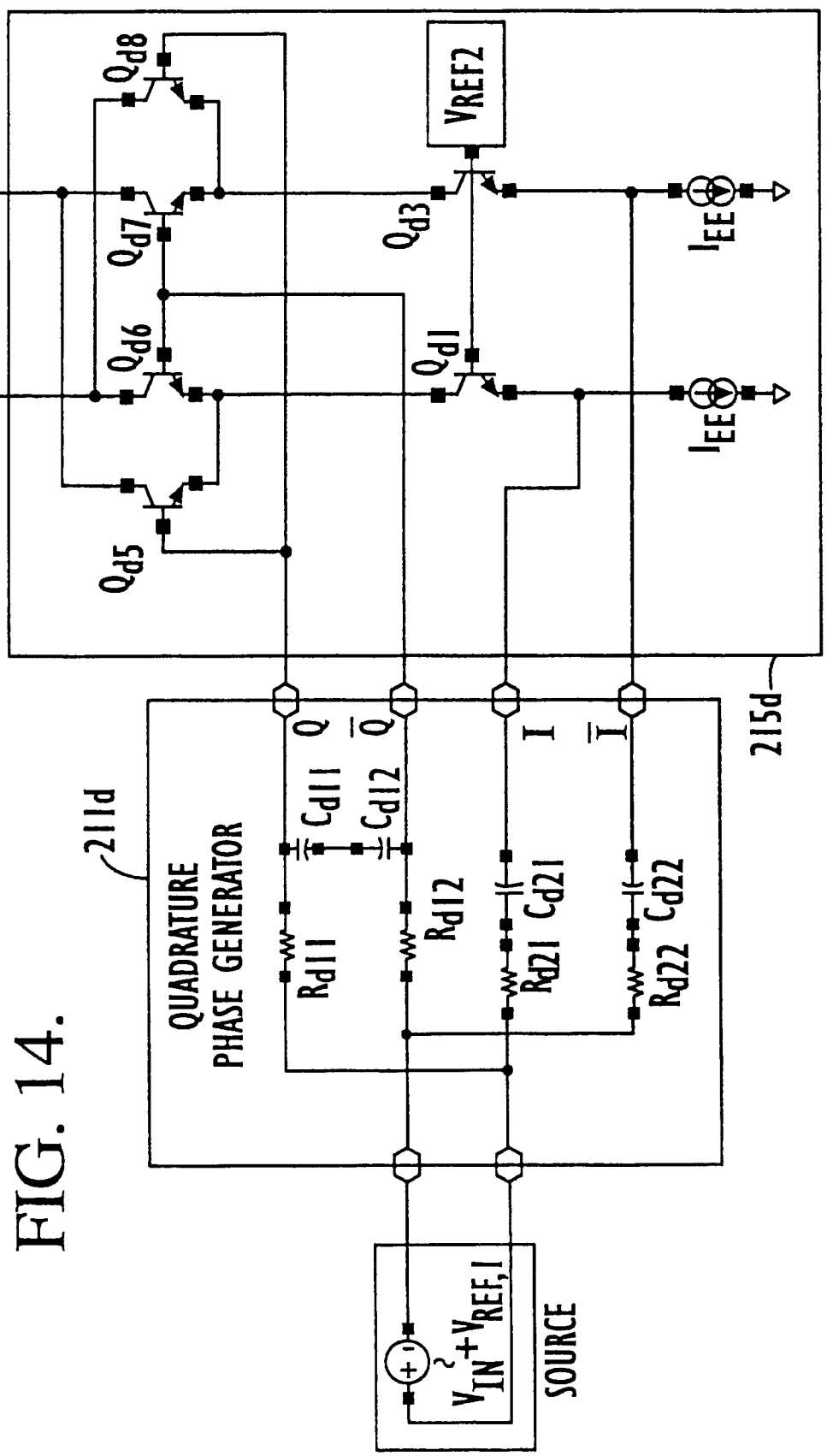

The frequency doubling circuit of FIG. 13 is quasi-differential. In particular, the biasing for the upper portion of the mixer 215c is provided through the DC biasing portion Vref1 added to the reference signal Vin and the resistors $R_{c11}$ and $R_{c12}$, and the biasing for the lower portion of the mixer 215c is set by the biasing voltage Vref2. The biasing voltage Vref2 also establishes the DC biasing current through the resistors $R_{EE}$. If current sources $I_{EE}$ are used as shown in FIG. 14, the current sources set the biasing current, and the biasing voltage Vref2 only sets the DC level for the transistors $Q_{d1}$ and $Q_{d3}$.

The input impedance into each side of the lower portion of the mixer 215c is relatively low (on the order of 1/gm for transistors $Q_{c1}$ and $Q_{c3}$). Moreover, the input impedance of the lower portion of the mixer 215c can either be much smaller than $R_{c21}$ and $R_{c22}$, or the input impedance can be factored in when the resistance values for $R_{c21}$ and $R_{c22}$ are chosen. The current into the collectors of transistors $Q_{d1}$ and $Q_{d3}$ can be determined by the signal current through resistor $R_{c21}$ and capacitor $C_{c21}$ and the signal current through resistor $Rc_{c22}$ and capacitor $C_{c22}$. These collector currents can then be toggled between the outputs based on the voltage difference between the inputs to the upper portion of the mixer 215c.

To achieve the desired quadrature phase shifting in the frequency doubling circuit of FIG. 13, the resistance and capacitance values for the quadrature phase generator 211c are preferably chosen as follows: $R_{c11}=R_{c12}=R_1$, and $C_{c11}=C_{c12}=C_1$ where $2\pi f_{IN}*R_1C_1=1$; and $R_{c21}=R_{c22}=R_2$, and $C_{c21}=C_{c22}=C_2$ where $2\pi f_{IN}*R_2C_2=1$. The resulting output waveforms for the frequency doubling circuit of FIG. 13 will be similar to those illustrated in FIGS. 12A and 12B for the frequency doubling circuit of FIG. 11. The frequency doubling circuit of FIG. 14 is similar to that of FIG. 13 with the exception that current sources $I_{EE}$ are substituted for the resistors $R_{EE}$.

The frequency doubling circuits of FIGS. 9, 11, 13, and 14 all include first order resistor-capacitor (RC) quadrature phase generators. Other quadrature phase generators, however, may be used. RC quadrature phase generators may be preferred because resistors and capacitors can be integrated into integrated circuit devices relatively easily. Inductor-capacitor (LC) or other lumped element quadrature phase generators, however, may also be used.

Figure 15:
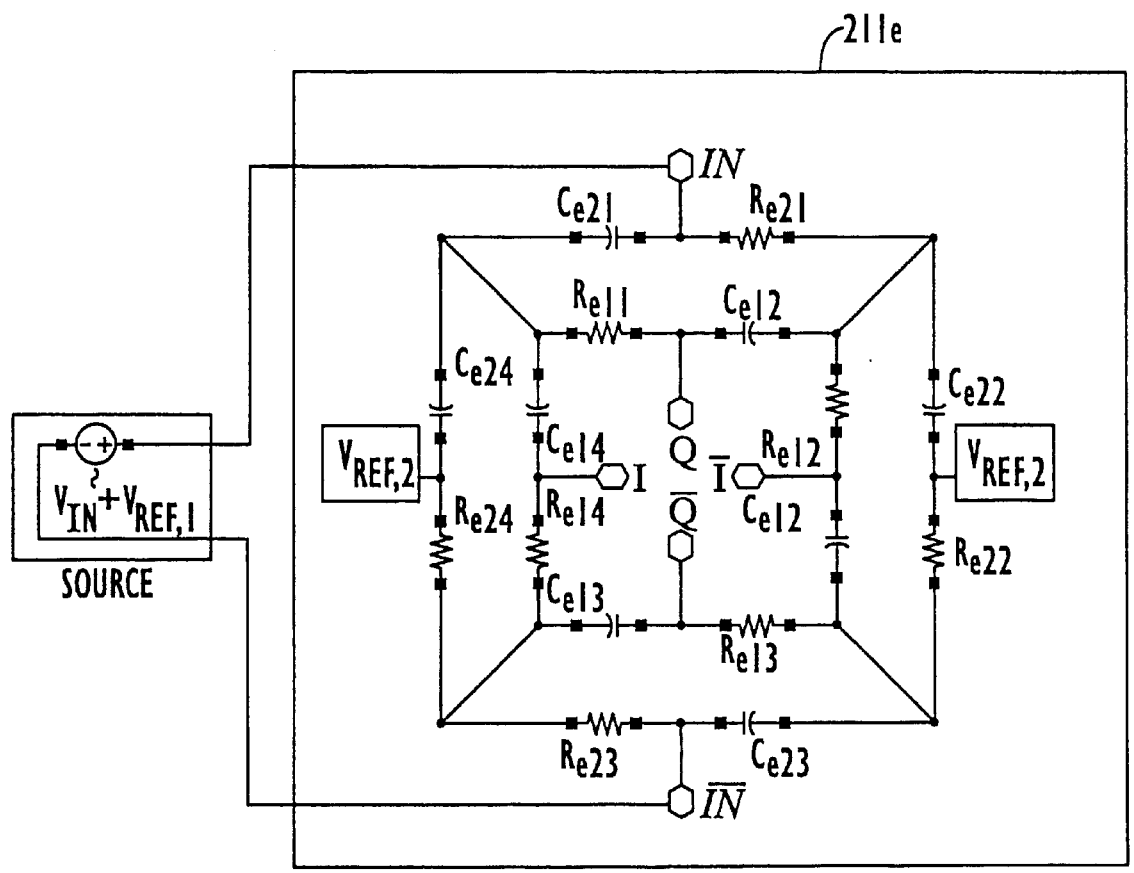
FIG. 15 is a schematic diagram of a polyphase quadrature phase generator for use in a frequency doubling circuit according to the present invention.

An example of an alternate RC quadrature phase generator 211e is illustrated in FIG. 15. In particular, the RC quadrature phase generator 211e is referred to as a polyphase quadrature phase generator, and the polyphase quadrature phase generator of FIG. 15 may achieve better matching of the output amplitudes over a wider range of frequencies while maintaining a high degree of quadrature phase accuracy. Preferably, all of the resistors have a common resistance of R ($R_{e11}=R_{e12}=R_{e13}=R_{e14}=R_{e21}=R_{e22}=R_{e23}=R_{e24}=$ R), all of the capacitors have a common capacitance of C ($C_{e11}=C_{e12}=C_{e13}=C_{e14}=C_{e21}=C_{e22}=C_{e23}=C_{e24}=C$), and $2\pi f_{IN}*RC=1$.

The frequency doubling circuits of the present invention can thus provide frequency doubled output signals having 50% duty cycles with a high degree of accuracy. In particular, the frequency doubling circuits of the present invention rely on quadrature phase generators that generate phase shifted signals such that a relative phase shift between two of the phase shifted signals is 90 degrees. The 90 degree relative phase shift can be accurately provided by accurately matching component values used to provide the quadrature phase generator without requiring accuracy in the absolute component values, and component values can be accurately matched when provided on a common integrated circuit substrate. In other words, the frequency doubling circuits of the present invention do not rely on the accuracy of an absolute time delay which may be dependent on the absolute values of the components used to provide the delay.

Figure 16:
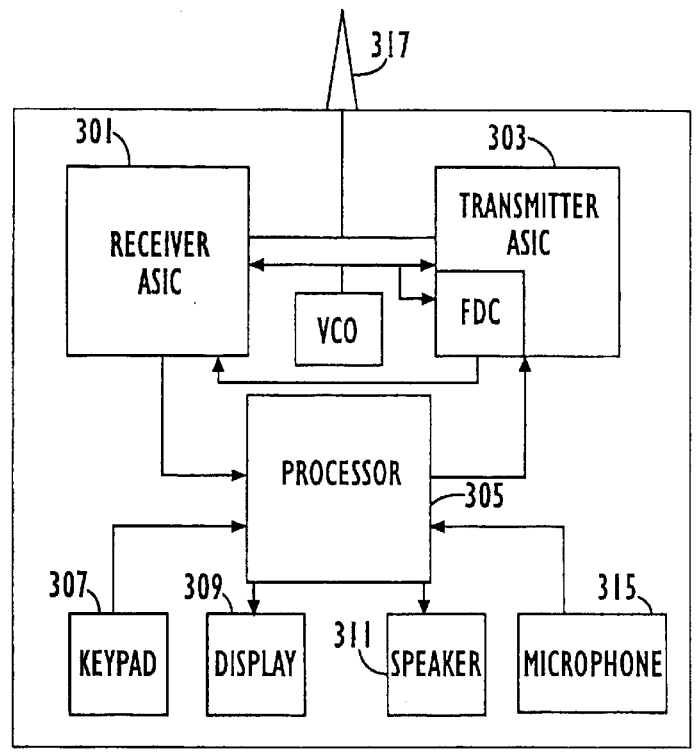
FIGS. 16 and 17 are block diagrams of radiotelephones including frequency doubling circuits according to the present invention.
Figure 17:
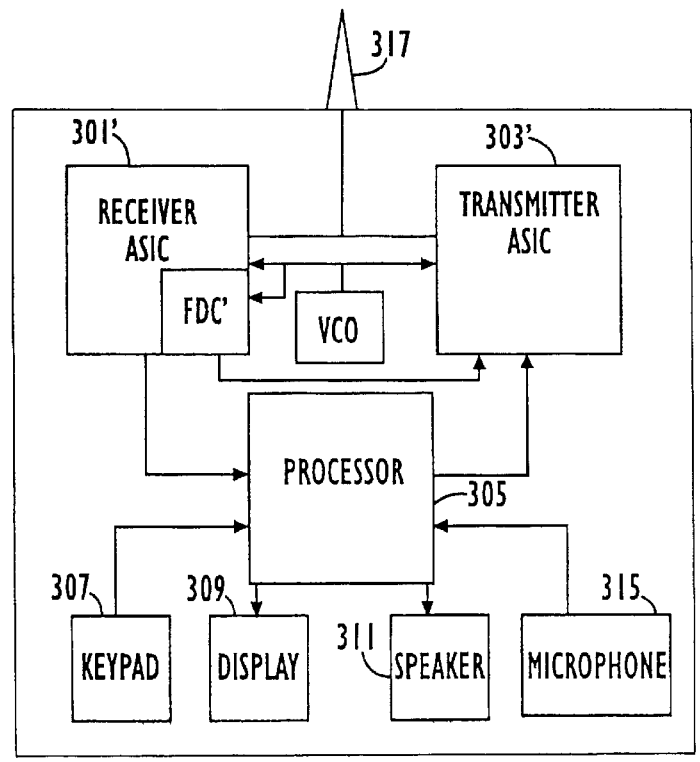

Frequency doubling circuits according to the present invention can thus be provided on an application specific integrated circuit (ASIC) so that additional components are not required. For example, a frequency doubling circuit according to the present invention can be provided on an ASIC including at least a portion of a receiver and/or transmitter of a dual mode communications device as shown in FIGS. 16 and 17. According to a particular example, a dual mode cellular radiotelephone can provide communications according to either the DAMPS standard at 900 MHz or the PCS standard at 1800 MHz. As shown in FIG. 16, a dual mode cellular radiotelephone can include a receiver provided on a receiver ASIC 301, a transmitter provided on a transmitter ASIC 303, a voltage controlled oscillator VCO, a frequency doubling circuit FDC, a processor 305, a keypad 307, a display 309, a speaker 311, a microphone 315, and an antenna 317. The operations of the processor, keypad, display, speaker, and microphone will be understood by those having skill in the art and will not be discussed further herein.

The frequency doubling circuit FDC of FIG. 16 is shown implemented on the transmitter application specific integrated circuit (ASIC) 303 including at least a portion of the radiotelephone transmitter, and the voltage controlled oscillator VCO is coupled to the transmitter ASIC 303 both directly and through the frequency doubling circuit FCD. Accordingly, the transmitter can use a 900 MHz signal coupled directly from the VCO to the transmitter during DAMPS operations. During PCS operations, the transmitter can use an 1800 MHz signal generated by the frequency doubling circuit responsive to the 900 MHz signal generated by the VCO. By providing the frequency doubling circuit on the transmitter ASIC, the desired matching of resistor and capacitor component values can be provided without adding additional components to the radiotelephone.

As further shown in FIG. 16, the 900 MHz signal is coupled directly from the VCO to the receiver ASIC 301 for use during DAMPS operations. In addition, the 1800 MHz signal from the frequency doubling circuit FDC is coupled to the receiver ASIC for use during PCS operations. Two operating frequencies can thus be generated without requiring two voltage controlled oscillators and without requiring additional parts in the radiotelephone.

The example of FIG. 17 is the same as the example of FIG. 16 with the exceptions that the receiver ASIC 301' includes a frequency doubling circuit FDC', and the transmitter ASIC 303' does not include a frequency doubling circuit. Accordingly, the output of the frequency doubling circuit FDC' is coupled from the receiver ASIC 301' to the transmitter ASIC 303' for use during PCS operations. Otherwise, the operations of the radiotelephone of FIG. 17 are the same as those discussed above with regard to FIG. 16.

Frequency doubling circuits according to the present invention can thus be used in dual mode communications devices to accept differential input signals and deliver frequency doubled differential output signals with accurate 50% duty cycles that do not have significant sensitivity to process tolerances. In addition, the frequency doubled output signals can be generated such that the amplitude, harmonic content, and duty cycle thereof are not strongly dependent on the amplitude of the input signal. Furthermore, the output signals can be provided with only weak dependence on the particular waveform of the input signal.

The differential frequency doubling circuits of the present invention can also draw a relatively constant supply current during frequency doubling operations so that cross talk to other circuits connected to a common supply line is reduced. As discussed above, the frequency doubling circuit can be provided on an ASIC already included in a communications device (such as a transmitter or receiver ASIC) so that additional components are not required. As further discussed above, the frequency doubling circuits of the present invention can provide low noise performance. In particular, little noise is generated by active devices of the frequency doubling circuit when the active devices are fully on or fully off so that noise contribution primarily occurs when active devices are being switched, and periods of switching can be reduced in the case of large signal operations. In addition, the frequency doubling circuits of the present invention can provide low voltage and low supply current operation thus reducing battery drain when the supply is a battery.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A frequency doubling circuit for doubling the frequency of a reference signal having a reference frequency, the frequency doubling circuit comprising:
   a quadrature phase generator that receives the reference signal having the reference frequency and that generates first and second quadrature phase shifted signals having the reference frequency; and
   a mixer coupled to the quadrature phase generator wherein the mixer receives the first and second quatrature phase shifted signals and generates an output signal having an output frequency twice that of the reference frequency.

2. A frequency doubling circuit according to claim 1:
   wherein the quadrature phase generator receives the reference signal having the reference frequency and an inverse reference signal that is 180 degrees out of phase with respect to the reference signal and wherein the quadrature phase generator also generates third and fourth quadrature phase shifted signals so that the second, third, and fourth quadrature phase shifted signals are respectively shifted 90 degrees, 180 degrees, and 270 degrees with respect to the first quadrature phase shifted signal; and
   wherein the mixer receives the four quadrature phase shifted signals to generate the output signal having the output frequency twice that of the reference frequency and to generate an inverse output signal that is 180 degrees out of phase with respect to the output signal.

3. A frequency doubling circuit according to claim 2 wherein the mixer comprises a multiplier.

4. A frequency doubling circuit according to claim 3 wherein the mixer comprises a Gilbert cell multiplier.

5. A frequency doubling circuit according to claim 1 wherein the mixer comprises an Exclusive-OR gate.

6. A frequency doubling circuit according to claim 1 wherein the mixer comprises a multiplier.

7. A frequency doubling circuit according to claim 6 wherein the mixer comprises a Gilbert cell multiplier.

8. A frequency doubling circuit according to claim 1 wherein the quadrature phase generator comprises a plurality of resistors and capacitors on an integrated circuit substrate wherein the resistors have a common resistance and wherein the capacitors have a common capacitance.

9. A frequency doubling circuit according to claim 1 wherein the quadrature phase shifted signals are shifted 90 degrees relative to each other.

10. A frequency doubling circuit according to claim 1 wherein the first quadrature phase shifted signal has a positive phase shift relative to the reference signal, and wherein the second quadrature phase shifted signal has a negative phase shift relative to the reference signal.

11. A frequency doubling circuit according to claim 10 wherein the first quadrature phase shifted signal has a positive 45 degree phase shift relative to the reference signal, and wherein the second quadrature phase shifted signal has a negative 45 degree phase shift relative to the reference signal.

12. A frequency doubling circuit according to claim 1 wherein the quadrature phase generator and the mixer are implemented on an integrated circuit substrate including a radio receiver.

13. A frequency doubling circuit according to claim 1 wherein the quadrature phase generator and the mixer are implemented on an integrated circuit substrate including a radio transmitter.

14. A frequency doubling method for doubling the frequency of a reference signal having a reference frequency, the method comprising the steps of:
   generating first and second quadrature phase shifted signals having the reference frequency; and
   generating an output signal having an output frequency twice that of the reference frequency responsive to the first and second quadrature phase shifted signals.

15. A method according to claim 14 further comprising the steps of:
   generating third and fourth quadrature phase shifted signals so that the second, third, and fourth quadrature phase shifted signals are respectively shifted 90 degrees, 180 degrees, and 270 degrees with respect to the first quadrature phase shifted signal; and
   generating an inverse output signal that is 180 degrees out of phase with respect to the output signal wherein the steps of generating the output and inverse output signals are responsive to the first, second, third, and fourth quadrature phase shifted signals.

16. A method according to claim 14 wherein the first and second quadrature phase shifted signals are shifted 90 degrees relative to each other.

17. A method according to claim 14 wherein the first quadrature phase shifted signal has a positive phase shift relative to the reference signal, and wherein the second quadrature phase shifted signal has a negative phase shift relative to the reference signal.

18. A method according to claim 17 wherein the first quadrature phase shifted signal has a positive 45 degree phase shift relative to the reference signal, and wherein the second quadrature phase shifted signal has a negative 45 degree phase shift relative to the reference signal.

19. A frequency doubling circuit for doubling the frequency of a reference signal having a reference frequency, the frequency doubling circuit comprising:
   means for generating first and second quadrature phase shifted signals having the reference frequency responsive to the to the reference signal; and
   means for generating an output signal having an output frequency twice that of the reference frequency responsive to the first and second quadrature phase shifted signals.

20. A frequency doubling circuit according to claim 19 further comprising:
   means for generating third and fourth quadrature phase shifted signals so that the second, third, and fourth quadrature phase shifted signals are respectively shifted 90 degrees, 180 degrees, and 270 degrees with respect to the first quadrature phase shifted signal; and
   wherein the means for generating the output signal comprises means for generating the output signal and for generating an inverse output signal that is 180 degrees out of phase with respect to the output signal responsive to the first, second, third, and fourth quadrature phase shifted signals.

21. A frequency doubling circuit according to claim 20 wherein the means for generating the output signal comprises a multiplier.

22. A frequency doubling circuit according to claim 21 wherein the means for generating the output signal comprises a Gilbert cell multiplier.

23. A frequency doubling circuit according to claim 19 wherein the means for generating the output signal comprises an Exclusive-OR gate.

24. A frequency doubling circuit according to claim 19 wherein the means for generating the output signal comprises a multiplier.

25. A frequency doubling circuit according to claim 24 wherein the emans for generating the output signal comprises a Gilbert cell multiplier.

26. A frequency doubling circuit according to claim 19 wherein the means for generating the first and second quadrature phase shifted signals comprises a plurality of resistors and capacitors on an integrated circuit substrate wherein the resistors have a common resistance and wherein the capacitors have a common capacitance.

27. A frequency doubling circuit according to claim 19 wherein the first and second quadrature phase shifted signals are shifted 90 degrees relative to each other.

28. A frequency doubling circuit according to claim 19 wherein the first quadrature phase shifted signal has a positive phase shift relative to the reference signal, and wherein the second quadrature phase shifted signal has a negative phase shift relative to the reference signal.

29. A frequency doubling circuit according to claim 28 wherein the first quadrature phase shifted signal has a positive 45 degree phase shift relative to the reference signal, and wherein the second quadrature phase shifted signal has a negative 45 degree phase shift relative to the reference signal.

30. A frequency doubling circuit according to claim 19 wherein the means for generating the first and second quadrature phase shifted signals and the means for generating the output signal are implemented on an integrated circuit substrate including at least a portion of a radio receiver.

31. A frequency doubling circuit according to claim 19 wherein the means for generating the first and second quadrature phase shifted signals and the means for generating the output signal are implemented on an integrated circuit substrate including a radio transmitter.

32. A radio communications device for transmitting and receiving radio communications, the radio communications device comprising:

a transmitter that transmits radio communications from the radio communications device;

a receiver that receives radio communications at the radio communications device;

a processor coupled to the transmitter and the receiver that controls transmission and reception of the radio communications; and a frequency generation circuit coupled to the transmitter and the receiver wherein the frequency generation circuit generates a communications frequency signal for the transmitter and receiver, the frequency generation circuit comprising, a reference signal generator that generates a reference signal having a reference signal, a quadrature phase generator that receives the reference signal having the reference frequency and that generates first and second quadrature phase shifted signals having the reference frequency, and a mixer coupled to the quadrature phase generator wherein the mixer receives the first and second quatrature phase shifted signals and generates the communications frequency signal having a communications frequency twice that of the reference frequency.

33. A radio communications device according to claim 32:

wherein the quadrature phase generator receives the reference signal having the reference frequency and an inverse reference signal that is 180 degrees out of phase with respect to the reference signal and wherein the quadrature phase generator also generates third and fourth quadrature phase shifted signals so that the second, third, and fourth quadrature phase shifted signals are respectively shifted 90 degrees, 180 degrees, and 270 degrees with respect to the first quadrature phase shifted signal; and wherein the mixer receives the four quadrature phase shifted signals to generate the output signal having the output frequency twice that of the reference frequency and to generate an inverse output signal that is 180 degrees out of phase with respect to the output signal.

34. A radio communications device according to claim 33 wherein the mixer comprises a multiplier.

35. A radio communications device according to claim 34 wherein the mixer comprises a Gilbert cell multiplier.

36. A radio communications device according to claim 32 wherein the quadrature phase generator comprises a plurality of resistors and capacitors on an integrated circuit substrate wherein the resistors have a common resistance and wherein the capacitors have a common capacitance.

37. A radio communications device according to claim 32 wherein the quadrature phase shifted signals are shifted 90 degrees relative to each other.

38. A radio communications device according to claim 32 wherein the first quadrature phase shifted signal has a positive phase shift relative to the reference signal, and wherein the second quadrature phase shifted signal has a negative phase shift relative to the reference signal.

39. A radio communications device according to claim 38 wherein the first quadrature phase shifted signal has a positive 45 degree phase shift relative to the reference signal, and wherein the second quadrature phase shifted signal has a negative 45 degree phase shift relative to the reference signal.

40. A radio communications device according to claim 32 wherein the quadrature phase generator and the mixer are implemented on an integrated circuit substrate including at least a portion of the receiver.

41. A radio communications device according to claim 32 wherein the quadrature phase generator and the mixer are implemented on an integrated circuit substrate including at least a portion of the transmitter.

42. A radio communications device according to claim 32 wherein the reference signal generator comprises a voltage controlled oscillator.

* * * * *